United States Patent [19]
Chang et al.

[11] Patent Number: 5,449,410
[45] Date of Patent: Sep. 12, 1995

[54] PLASMA PROCESSING APPARATUS

[75] Inventors: Mei Chang, Cupertino; Cissy Leung, Fremont, both of Calif.

[73] Assignee: Applied Materials, Inc., Santa Clara, Calif.

[21] Appl. No.: 98,538

[22] Filed: Jul. 28, 1993

[51] Int. Cl.⁶ .............................................. C23C 16/00
[52] U.S. Cl. ......................... 118/723 ER; 118/723 E
[58] Field of Search ................... 156/643; 118/723 E, 118/723 ER, 723 I, 723 IR, 723 R

[56] References Cited
U.S. PATENT DOCUMENTS

| | | | |
|---|---|---|---|
| 4,981,722 | 1/1991 | Moller et al. | 156/643 |
| 5,275,683 | 1/1994 | Arami et al. | 156/643 |
| 5,275,977 | 1/1994 | Otsubo et al. | 156/643 |
| 5,310,453 | 5/1994 | Fukasawa et al. | 156/643 |
| 5,342,471 | 8/1994 | Fukasawa et al. | 118/723 E |
| 5,342,472 | 8/1994 | Imahasi et al. | 156/643 |

*Primary Examiner*—Olik Chaudhuri
*Assistant Examiner*—Brian K. Dutton
*Attorney, Agent, or Firm*—Donald S. Cohen

[57] ABSTRACT

A plasma processing apparatus has a chamber with an open top and a cover plate extending across the open top of the chamber. The cover plate has an opening therethrough. An annular shield of an electrical insulating material is secured to the cover plate around the opening and extends partially across the opening. An aluminum showerhead is within the shield and has holes therethrough through which a gas can pass into the chamber. The showerhead is connected to a source of RF voltage to provide a flow of RF power between the showerhead and an electrode within the chamber. The shield has a plurality of openings therethrough which allows the RF power to flow through the openings from the showerhead to the electrode in the event that the showerhead becomes coated with particles of an insulating material.

18 Claims, 2 Drawing Sheets

5,449,410

PLASMA PROCESSING APPARATUS

FIELD OF THE INVENTION

The present invention is directed to plasma processing apparatus, and, more particularly, to a plasma processing apparatus which limits the formation of contaminating particles, such as particles of aluminum fluoride (AlF), which reach a body being processed.

BACKGROUND OF THE INVENTION

A plasma processing apparatus, in general, comprises a chamber having therein a susceptor for supporting a body to be processed, and a pair of spaced electrodes. The susceptor can be one of the electrodes. The other electrode can be a showerhead through which various gases are admitted into the chamber to generate a plasma in the chamber. The susceptor electrode and the showerhead electrode are generally made of aluminum. The showerhead electrode is generally connected to a source of RF voltage and the susceptor electrode is generally grounded so that rf power is dissipated between the showerhead electrode and the susceptor electrode to generate a plasma in the gas in the chamber. The particular process achieved in the apparatus depends on the gas or gases used. Some gases result in an etching of the body on the susceptor, and other gases react to deposit a layer on the body.

Prior to performing a processing step in the chamber, it is common to clean the chamber by passing nitrogen fluoride ($NF_3$) into the chamber. During this cleaning operation, any aluminum parts in the chamber, such as the electrodes, react with the fluorine to form particles of aluminum fluoride (AlF) on the surface thereof. Since aluminum fluoride is an insulating material, the showerhead electrode then has particles of an insulating material over an exposed surface thereof which limit RF power dissipation between the electrodes and thus limit a plasma needed for a particular reaction. The plasma reaction in the chamber can induce micro-arcing which results in the aluminum fluoride flaking off of the showerhead. These particles of aluminum fluoride can deposit on the body being processed and thus adversely affect the characteristics of circuitries and/or devices being formed in and/or on the body.

SUMMARY OF THE INVENTION

Viewed from one aspect, the present invention is directed to plasma processing apparatus comprising a processing chamber, first and second spaced apart electrodes in the chamber, electrical insulating means, and facilitating means. The electrodes are adapted to be coupled to a source of RF power. The electrical insulating means is around the first electrode, is between the first electrode and the chamber, and insulates the first electrode from the chamber. The facilitating means facilitates RF power flow from the first electrode through the insulating means to the second electrode in the event that during operation of the plasma processing apparatus the first electrode becomes partly coated with particles of an electrical insulating material which limits RF power flow between the electrodes.

Viewed from an other aspect, the present invention is directed to plasma processing apparatus comprising a processing chamber having an open top, a cover plate extending across the top of the chamber and having an opening therethrough, an annular shield of an electrical insulating material secured to the cover plate around the opening in the cover plate and extending partially across the opening in the cover plate, a showerhead first electrode mounted within the shield and defining openings therethrough which facilitate the introduction of a gas flow into the chamber, a second electrode in the chamber spaced from the showerhead, and facilitating means. The showerhead first electrode is adapted to be coupled to a source of RF voltage. The facilitating means facilitates RF power flow from the showerhead first electrode through the annular shield to the second electrode in the event that during operation of the plasma processing apparatus the showerhead first electrode becomes partly coated with particles of an electrical insulating material which limits RF power flow between the electrodes.

The invention will be better understood from the following more detailed description and claims taken with the accompanying drawings.

The drawings are not necessarily to scale.

DETAILED DESCRIPTION

Figure 1:
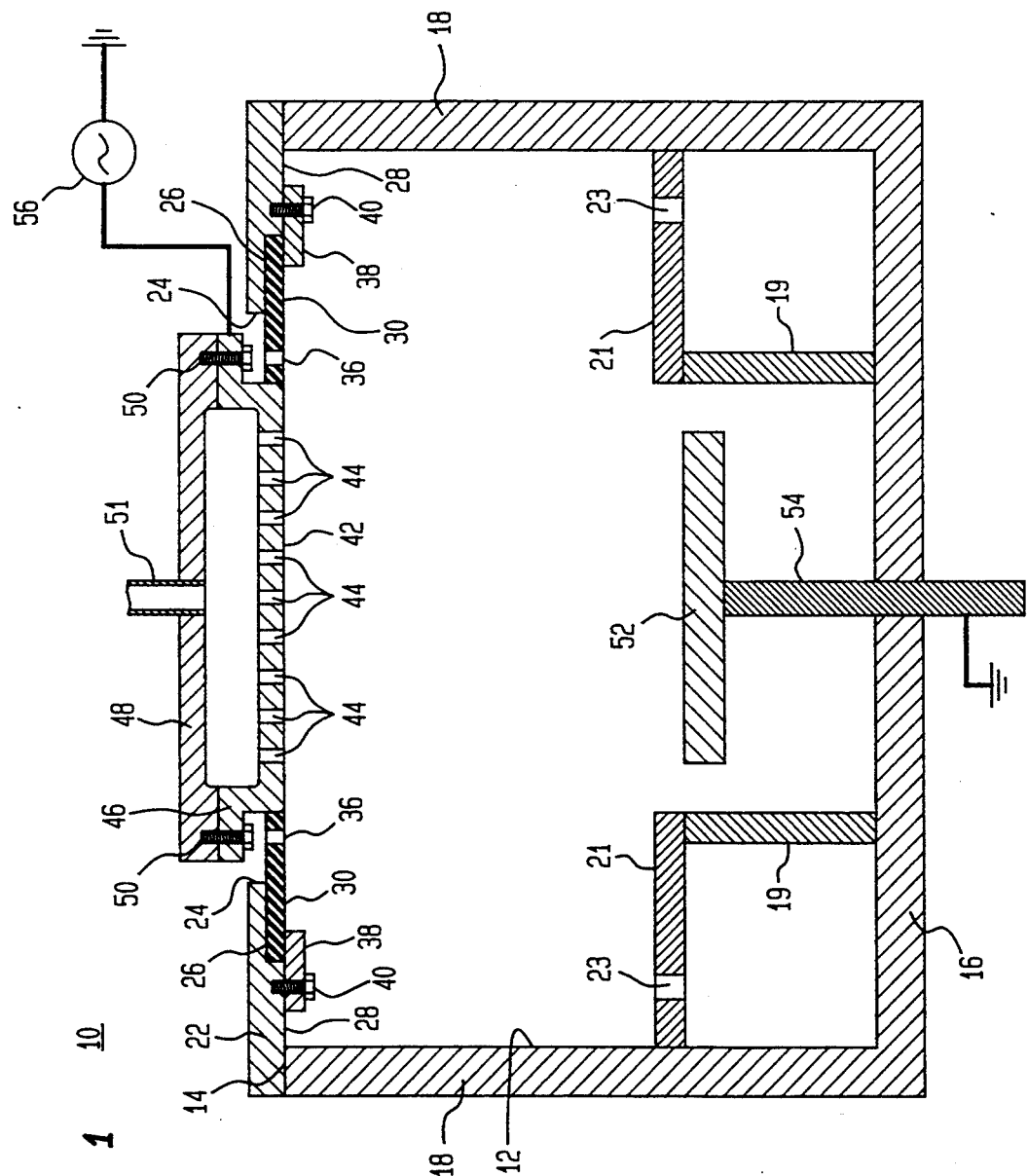
FIG. 1 is a schematic sectional view of plasma processing apparatus in accordance with the present invention.
Figure 2:
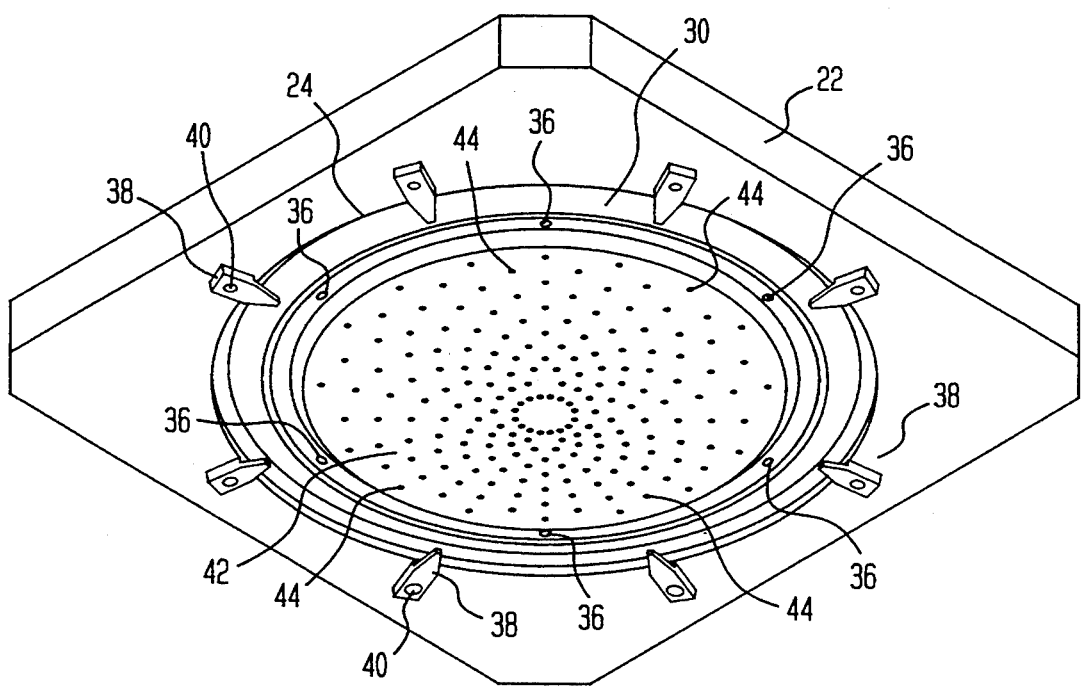
FIG. 2 is an enlarged perspective view of a showerhead mounting portion of the apparatus shown in FIG. 1.

Referring now to FIGS. 1 and 2, there are shown a schematic sectional view (FIG. 1) of a plasma processing apparatus 10 in accordance with the present invention, and an enlarged perspective view (FIG. 2) of a portion of the apparatus 10. Plasma processing apparatus 10 comprises a processing chamber 12 having an open top 14, a bottom wall 16, and side walls 18. A cover plate 22 extends across the top 14 of the chamber 12 and is secured to the side walls 18. Cover plate 22 has a central opening 24 therethrough, and a recess 26 in an inner surface 28 thereof around the opening 24. An insulating shield 30 is mounted in the recess 26 in the cover plate 22 and projects radially inwardly across a portion of the opening 24.

Figure 3:
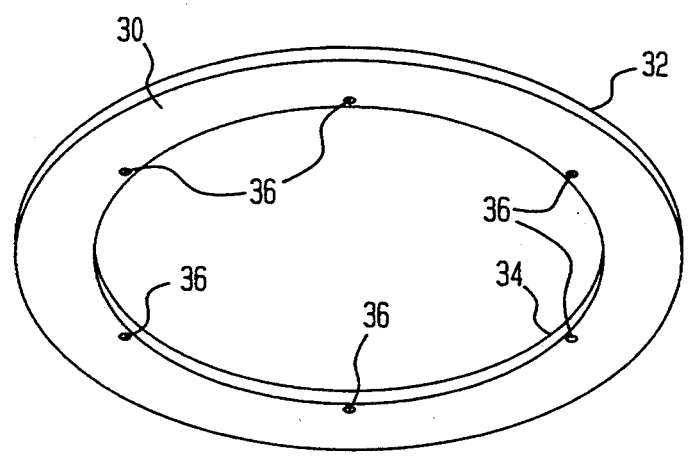
FIG. 3 is an enlarged perspective view of the electrical insulating shield used in the apparatus shown in FIGS. 1 and 2.

Referring now to FIG. 3, there is shown an enlarged perspective view of the insulating shield 30 shown in FIGS. 1 and 2. As shown, the insulating shield 30 is a flat annular ring of a relatively rigid insulating material, such as alumina. The shield 30 has an outer peripheral edge 32 and an inner peripheral edge 34. A plurality of openings 36 extend through the shield 30 between the peripheral edges 32 and 34. The openings 36 are adjacent the inner peripheral edge 34 and are uniformly spaced around the shield 30. The shield 30 with openings 36 may be denoted as means for facilitating RF power flow from showerhead 42 to susceptor 52.

As shown in FIGS. 1 and 2, the shield 30 is secured in the recess 26 in the cover plate 22 by a plurality of retainers 38. Each of the retainers 38 is secured to the inner surface 28 of the cover plate 22 by a screw 40 and extends across a portion of the shield 30 from the outer peripheral edge 32 of the shield 30. The retainers 38 are uniformly spaced around the shield 30.

An aluminum showerhead 42 is mounted within the shield 30. The showerhead 42 has a plurality of small openings 44 therethrough to allow a gas to flow from the showerhead 42 into the chamber 12. A mounting flange 46 projects radially from the showerhead 42. The mounting flange 46 extends over the shield 30 from the inner peripheral edge 34 of the shield 30. A gas manifold 48 is over the showerhead 42. As shown in FIG. 1, the showerhead 42 is secured to the manifold 48 by a plurality of screws 50 which extend through the mounting flange 46 of the showerhead 42 and are threaded into the manifold 48. A gas inlet pipe 51 extends into the manifold 48 and is connected through a gas switching network (not shown) to sources (not shown) of various gases. The number of openings 36 in the shield 30 is typically equal to the number of screws 50 securing the showerhead 42 to the manifold 48. As shown in FIG. 1, each of the openings 36 in the shield 30 is in alignment with a separate screw 50.

An aluminum susceptor 52 is within the chamber 12 and is adapted to support a body (not shown) which is to be processed. The susceptor 52 is in the form of a plate which extends parallel to the showerhead 42. The susceptor 52 is mounted on the end of a shaft 54 which extends vertically through the bottom wall 16 of the chamber 12. The shaft 54 is movable vertically so as to permit the movement of the susceptor 52 toward and away from the showerhead 42.

Plasma processing apparatus 10 further comprises walls 19 on each side of susceptor 52 and pumping plates 21 each having an opening 23. The walls 19 are adjacent sides of susceptor 52 and extend down to bottom wall 16. Each pumping plate 21 extends between a vertical wall 18 and a top portion of a wall 19. During operation of plasma processing apparatus 10, gas flowing into inlet pipe 51 flows through openings 44 in showerhead 42, into chamber 12, through openings 23 in pumping plates 21, and then out of plasma processing apparatus 10 via output pipes (not shown). Walls 19 and 21 may be denoted as evacuating means for evacuating any gas introduced into the chamber 12.

The showerhead 42 is connected to an RF power source 56. Thus, the showerhead 42 serves as one electrode of the processing apparatus 10. However, the showerhead 42 is electrically insulated from the chamber 12 by the insulating shield 30. The susceptor 52 is connected to ground so that it serves as the other electrode of the processing apparatus 10.

The processing apparatus 10 can be used to perform any type of plasma processing, such as CVD deposition, etching, etc. However, prior to performing the desired processing steps, it is the practice to first clean the chamber 12. This is generally achieved by admitting a cleaning gas, typically nitrogen fluoride ($NF_3$), into the chamber 12 through the showerhead 42. Other fluorine containing gases, such as $SF_6$ or $C_2F_6$, could be substituted for $NF_3$. The RF power source 56 is turned on to create a plasma in the chamber 12 between the showerhead 42 and the susceptor 52. This results in the generation of fluorine which cleans the chamber 12. However, the fluorine also reacts with the aluminum showerhead 42 forming particles of aluminum fluoride (AlF) on a surface of the showerhead 42 which faces into the chamber 12 and is directly above a body (not shown) which is on susceptor 52 and is to be processed. Since the aluminum fluoride particles on the surface of the showerhead 42 are electrically insulating, they interfere with the flow of RF power between the showerhead 42 and the susceptor 52. The potential generated during an RF induced plasma generated in the chamber 12 during processing of a body (not shown but positioned on susceptor 52) between the particles of AlF on the showerhead 42 and the showerhead 42 varies and facilitates electrical arcing which can cause particles of AlF to break off of showerhead 42 and to land on the body (not shown) therebelow.

Apparatus 10 acts to limit the number of particles which can deposit on a body on susceptor 52. The screws 50 are outside the chamber 12 and are each above one of the openings 36 in the shield 32. The body is of a preselected size such that the opening 36 in the shield 32 are not directly above the body. During cleaning of the apparatus 10 with fluorine, particles of AlF form on ends of the screws 50 as well as on the showerhead 42. An intense plasma has been observed in openings 36 which gives rise to AlF particles being formed on screws 50. In accordance with one aspect of the invention, an alternative RF path is provided by screws 50, openings 36 in shield 32, and susceptor 52, so that RF power flows between screws 50 as one electrode and susceptor 52 as the other electrode. In this manner, the screws 50 and the openings 36 in the shield 32 tend to improve the overall flow of RF power between showerhead 42 and susceptor 52. This tends to reduce arcing between the showerhead 42 and any AlF particles which may form thereon and thus helps to reduce the risk of AlF particles breaking off showerhead 42 and falling on a body being processed therebelow.

Another advantage is a reduction in the original accumulation of AlF particles on the surface of showerhead 42. Although at the same time, particles also form on screws 50, such particles are less of an issue, particularly if formation on the showerhead is lessened, and because the screws are not located directly over the susceptor 52, and any wafer to be processed thereon. Also chamber 12 can first be cleaned using $NF_3$ and then the screws 50 which may have some AlF deposited thereon may if desired be replaced with a new set of clean screws 50. To further reduce the risk of loose particles, during the processing of a body in chamber 12, gases are removed through the openings 23 in pumping plates 21 at outer lower positions of chamber 12 such that any loose particles of AlF tend to flow away from a body which is on susceptor 52.

It is to be appreciated and understood that the specific embodiments of the invention are merely illustrative of the general principles of the invention. Various modifications may be made consistent with the principles set forth. For example, although the shield 32 is stated to be of alumina, it can be formed of any electrical insulating material which is relatively rigid and can withstand the temperatures of the processing carried out in the apparatus 10. Also, although the shield 32 is shown to have circular outer and inner peripheral edges 34 and 36, it can have edges of any desired shape, such as rectangular, square, etc. Also, the inner peripheral edge 36 does not have to be the same shape as the outer peripheral edge 34. However, the inner peripheral edge 36 should be of the same shape as the showerhead 42 to allow the showerhead 42 to fit within the shield 32. The openings 36 in shield 30 are not required to be aligned below the screws 50, although such alignment is preferred as facilitating the flow of RF power. It is only necessary that the opening in shield 30 provide an RF pathway between susceptor 52 as one electrode and exposed metal serving as the other electrode on the side of shield 30 opposite susceptor 52. Although the utilization of screws 50 as alternative electrodes for the alternative RF path is preferred, it is not required, and any exposed metal on the side of shield 32 opposite the chamber would likewise be effective. It can be advantageous if such exposed metal is protruding toward the shield, but again, it would not be essential.

What is claimed is:

1. Plasma processing apparatus comprising:
    a processing chamber;
    first and second spaced apart electrodes in the chamber, the electrodes being adapted to be coupled to a source of rf power;
    electrical insulation around the first electrode and between the first electrode and the chamber for insulating the first electrode from the chamber, said electrical insulation having inner and outer peripheral edges; and
    means extending through the electrical insulation for facilitating rf power flow from the first electrode through the electrical insulation to the second electrode in the event that during operation of the plasma processing apparatus the first electrode becomes partly coated with particles of an electrical insulating material which limits rf power flow between the electrodes.

2. The plasma processing apparatus of claim 1 in which the electrical insulating means comprises a substantially rigid, annular shield of an electrical insulating material having inner and outer peripheral edges, and the first electrode fits within the inner peripheral edge.

3. The plasma processing apparatus of claim 2 in which the means for facilitating the flow of RF power through the insulating means comprises at least one opening extending through the annular shield between peripheral edges thereof.

4. The plasma processing apparatus of claim 3 in which the annular shield defines a plurality of openings therethrough and spaced around the shield.

5. The plasma processing apparatus of claim 4 in which the first electrode comprises a showerhead defining a plurality of holes therethrough through which a gas can flow into the chamber.

6. The plasma processing apparatus of claim 5 in which the showerhead is of aluminum.

7. The plasma processing apparatus of claim 6 further comprising:
    a manifold which extends over the showerhead;
    the showerhead having a mounting flange extending radially outwardly therefrom over the shield; and
    screws extend through the mounting flange of the showerhead into the manifold so as to secure the showerhead to the manifold.

8. The plasma processing apparatus of claim 7 in which each of the openings in the shield is in alignment with a separate screw in the mounting flange of the showerhead.

9. The plasma processing apparatus of claim 1 further comprising evacuating means located near the second electrode for evacuating any gas introduced into the chamber.

10. Plasma processing apparatus comprising:
    a processing chamber having an open top;
    a cover plate extending across the top of the chamber and having an opening therethrough;
    an annular shield of an electrical insulating material secured to the cover plate around the opening the cover plate and extending partially across the opening in the cover plate;
    a showerhead mounted within the shield and defining openings therethrough which facilitate the introduction of a gas flow into the chamber, the showerhead being adapted to serve as a first electrode and to be coupled to a source of rf voltage;
    a second electrode in the chamber spaced from the showerhead; and
    means extending through the annular shield for facilitating rf power flow from the showerhead first electrode through the annular shield to the second electrode in the event that during operation of the plasma processing apparatus the showerhead first electrode becomes partly coated with particles of an electrical insulating material which limits rf power flow between the electrodes.

11. The plasma processing apparatus of claim 10 in which the means for facilitating flow of rf power through the shield comprises at least one opening through the annular shield between the peripheral edges thereof.

12. The plasma processing apparatus of claim 11 in which the annular shield defines a plurality of openings therethrough spaced therearound.

13. The plasma processing apparatus of claim 12 in which the showerhead is of aluminum.

14. The plasma processing apparatus of claim 13 further comprising:
    a manifold which extends over the showerhead;
    the showerhead having a mounting flange extending radially outwardly therefrom over the annular shield; and
    screws extend through the mounting flange of the showerhead into the manifold so as to secure the showerhead to the manifold.

15. The plasma processing apparatus of claim 14 in which each of the openings in the annular shield is in alignment with a separate screw in the mounting flange of the showerhead.

16. The plasma processing apparatus of claim 15 in which the second electrode is a susceptor which is adapted to support a body to be processed in the chamber.

17. The plasma processing apparatus of claim 10 further comprising evacuating means located near the second electrode for evacuating any gas introduced into the chamber.

18. Plasma processing apparatus comprising:
    a processing chamber;
    first and second spaced apart electrodes in the chamber, the electrodes being adapted to be coupled to a source of rf power;
    electrical insulation around the first electrode and between the first electrode and the chamber for insulating the first electrode from the chamber, said electrical insulation having inner and outer peripheral edges; and
    at least one opening extending through the electrical insulation between the peripheral edges thereof for facilitating rf power flow from the first electrode through the electrical insulation to the second electrode in the event that during operation of the plasma processing apparatus the first electrode becomes partly coated with particles of an electrical insulating material which limits rf power flow between the electrodes.

* * * * *